US 11,837,429 B2

(12) United States Patent
Yoshino (10) Patent No.: US 11,837,429 B2
(45) Date of Patent: Dec. 5, 2023

(54) BLANKING APERTURE ARRAY UNIT

(71) Applicant: Nuflare Technology, Inc., Yokohama (JP)

(72) Inventor: Shuji Yoshino, Kunitachi (JP)

(73) Assignee: Nuflare Technology, Inc., Yokohama (JP)

( * ) Notice: Subject to any disclaimer, the term of this patent is extended or adjusted under 35 U.S.C. 154(b) by 0 days.

(21) Appl. No.: 17/663,442

(22) Filed: May 16, 2022

(65) Prior Publication Data

US 2022/0392731 A1   Dec. 8, 2022

(30) Foreign Application Priority Data

Jun. 2, 2021   (JP) ................................. 2021-093207

(51) Int. Cl.
*H01J 37/04* (2006.01)
*H01J 37/317* (2006.01)
*H01J 37/147* (2006.01)

(52) U.S. Cl.
CPC ........ *H01J 37/045* (2013.01); *H01J 37/1472* (2013.01); *H01J 37/3177* (2013.01); *H01J 2237/026* (2013.01); *H01J 2237/0437* (2013.01); *H01J 2237/1504* (2013.01)

(58) Field of Classification Search
CPC .. H01J 37/045; H01J 37/1472; H01J 37/3177; H01J 2237/026; H01J 2237/0437; H01J 2237/1504
See application file for complete search history.

(56) References Cited

U.S. PATENT DOCUMENTS

| 9,530,616 | B2 | 12/2016 | Yamashita et al. |
| 9,966,229 | B2 | 5/2018 | Matsumoto |
| 2008/0283767 | A1 | 11/2008 | Platzgummer |
| 2016/0099129 | A1 | 4/2016 | Yamashita et al. |
| 2017/0110288 | A1* | 4/2017 | Matsumoto ......... H01J 37/3007 |
| 2018/0374768 | A1* | 12/2018 | Chiba .................... H01L 29/06 |

FOREIGN PATENT DOCUMENTS

| JP | 4-45265 Y2 | 10/1992 |
| JP | 11-154599 A | 6/1999 |
| JP | 2009-182023 A | 8/2009 |
| JP | 5491704 B2 | 5/2014 |
| JP | 2016-76548 A | 5/2016 |
| JP | 2017-79259 A | 4/2017 |

* cited by examiner

*Primary Examiner* — Sean M Luck
(74) *Attorney, Agent, or Firm* — Oblon, McClelland, Maier & Neustadt, L.L.P.

(57) ABSTRACT

A blanking aperture array unit according to the present embodiment includes a chip configured to control a charged particle beam by blanking control of switching whether to irradiate a target with the charged particle beam; a substrate having the chip mounted thereon; a wire configured to electrically connect pads on the chip to the substrate and transmit a control signal for the blanking control from the substrate to the chip through the pads; and a conductive covering member having a first end connected to the substrate and a second end located on the chip, the covering member being provided from the first end to the second end to cover the wire while maintaining electrical insulation from the wire, and at least two end sides of the second end of the covering member are nearer a central portion of the chip than locations of the pads on the chip.

14 Claims, 5 Drawing Sheets

BLANKING APERTURE ARRAY UNIT

CROSS REFERENCE TO RELATED APPLICATIONS

This application is based upon and claims the benefit of priority from the prior Japanese Patent Application No. 2021-093207, filed on Jun. 2, 2021, the entire contents of which are incorporated herein by reference.

FIELD

The embodiments of the present invention relate to a blanking aperture array unit.

BACKGROUND

An electron beam lithography apparatus irradiates a mask blank with an electron beam to draw a mask pattern thereon, thereby forming a photomask. A lithography apparatus using multi-beams is sometimes used as the electron beam lithography apparatus. Such a multi-beam lithography apparatus shapes, for example, an electron beam emitted from an electron gun into multi-beams using a shaping aperture array including a plurality of openings. The multi-beam lithography apparatus then executes blanking control of the multi-beams with a blanking aperture array (BAA) and reduces and deflects unblocked beams with an optical system to irradiate a specimen therewith.

When electrons hit the inner surfaces of the openings of the shaping aperture array at the time of shaping of the multi-beams, scattered electrons are emitted. When these scattered electrons reach the blanking aperture array, an insulator of the substrate of the blanking aperture array is charged. In this case, there is a problem that a malfunction is likely to occur in the blanking control. Furthermore, if the scattered electrons flow in a metallic wire, noise occurs in a control signal for the blanking control. In this case, there is also a problem that the blanking control is likely to be destabilized.

DETAILED DESCRIPTION

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A blanking aperture array unit according to the present embodiment includes a chip configured to control a charged particle beam by blanking control of switching whether to irradiate a target with the charged particle beam; a substrate having the chip mounted thereon; a wire configured to electrically connect pads on the chip to the substrate and transmit a control signal for the blanking control from the substrate to the chip through the pads; and a conductive covering member having a first end connected to the substrate and a second end located on the chip, the covering member being provided from the first end to the second end to cover the wire while maintaining electrical insulation from the wire, and at least two end sides of the second end of the covering member are nearer a central portion of the chip than locations of the pads on the chip.

First Embodiment

Figure 1:
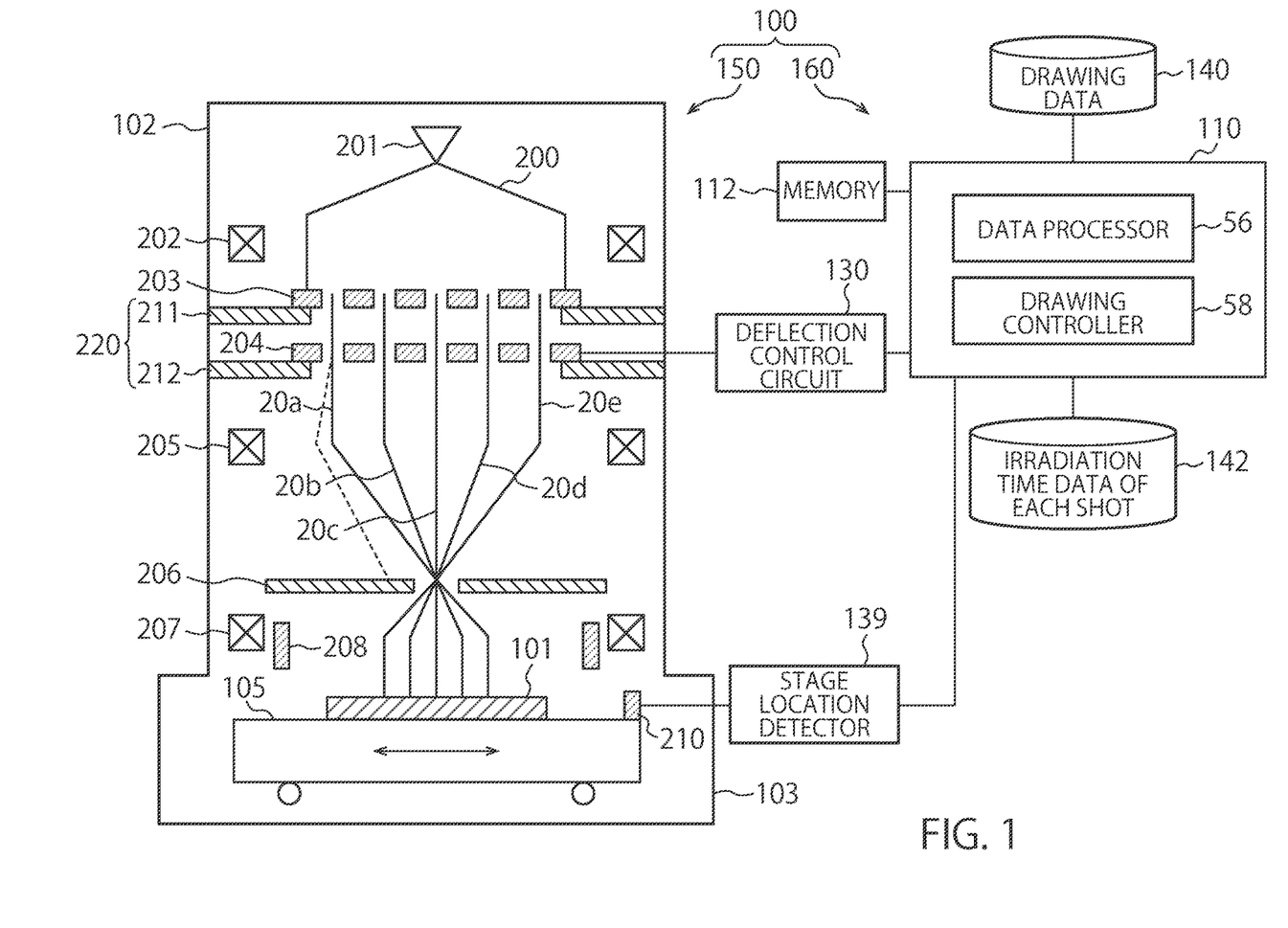
FIG. 1 is a conceptual diagram illustrating an example of a configuration of a lithography apparatus according to a first embodiment.

FIG. 1 is a conceptual diagram illustrating an example of the configuration of a lithography apparatus according to a first embodiment. A lithography apparatus 100 is, for example, a multi charged-beam exposure apparatus and is used to draw a photomask of lithography to be used for manufacturing of semiconductor devices. The present embodiment may be applied to apparatuses that irradiate a target with an electron beam (a charged particle beam) or light, such as an exposure apparatus, an electron microscope, and an optical microscope, as well as the lithography apparatus. Therefore, a specimen 101 as the target may be a semiconductor substrate or the like, as well as a mask blank.

The lithography apparatus 100 includes a lithography part 150 and a controller 160. The lithography part 150 includes an electron lens barrel 102 and a drawing chamber 103. An electron gun 201, an illuminating lens 202, a shaping aperture array substrate 203, a blanking aperture array mechanism 204, a reducing lens 205, a restrictor 206, an objective lens 207, a deflector 208, a shaping aperture stage mechanism 211, and a blanking aperture stage mechanism 212 are placed in the electron lens barrel 102. An XY stage 105 is placed in the drawing chamber 103. The specimen 101 such as a mask blank being a target at the time of drawing can be mounted on the XY stage 105. The specimen 101 may be a semiconductor substrate (a silicon wafer) or the like. A mirror 210 is placed on the XY stage 105 to measure the location of the XY stage 105.

The shaping aperture stage mechanism 211 is placed in the electron lens barrel 102, and the shaping aperture array substrate 203 is mounted on the shaping aperture stage mechanism 211. The blanking aperture stage mechanism 212 is placed below the shaping aperture stage mechanism 211 and the blanking aperture array mechanism 204 is mounted on the blanking aperture stage mechanism 212. Hereinafter, the shaping aperture array substrate 203, the blanking aperture array mechanism 204, the shaping aperture stage mechanism 211, and the blanking aperture stage mechanism 212 are also referred to collectively as "aperture mechanism 220".

The shaping aperture array substrate 203 includes a plurality of openings and shapes an electron beam 200 into multi-beams 20a to 20e.

The blanking aperture array mechanism 204 executes blanking control of each of the multi-beams 20a to 20e. The blanking control is control of switching whether to irradiate the specimen 101 with the multi-beams 20a to 20e with respect to each of the beams. When the blanking control is in an ON state, the multi-beam 20a passing through the blanking aperture array mechanism 204 is deflected by application of a voltage as indicated by a dotted line in FIG. 1. The deflected multi-beam 20a is blocked (blanked) by the restrictor 206. On the other hand, when the blanking control is in an OFF state, the multi-beam 20a reaches the specimen 101. A more detailed configuration of the blanking aperture array mechanism 204 will be explained with reference to FIG. 2.

The controller 160 includes a control calculator 110, a memory 112, a deflection control circuit 130, a stage location detector 139, and storage devices 140 and 142 such as magnetic disk devices. The control calculator 110, the memory 112, the deflection control circuit 130, the stage location detector 139, and the storage devices 140 and 142 are connected to each other via a bus (not illustrated). The storage device 140 has stored therein drawing data input from outside. The storage device 142 has stored therein irradiation time data of each shot.

The control calculator 110 includes a data processor 56 and a drawing controller 58. Each of the data processor 56 and the drawing controller 58 includes a processing circuit, and the processing circuit includes an electrical circuit, a computer, a processor, a circuit substrate, a quantum circuit, a semiconductor device, or the like. A common processing circuit (a same processing circuit) may be used for the data processor 56 and the drawing controller 58, or different processing circuits may be used therefor. Information input to or output from the data processor 56 and the drawing controller 58, and information being computed are stored in the memory 112 each time.

Here, a configuration required for explaining the first embodiment is illustrated in FIG. 1. The lithography apparatus 100 may include other required configurations.

Figure 2:
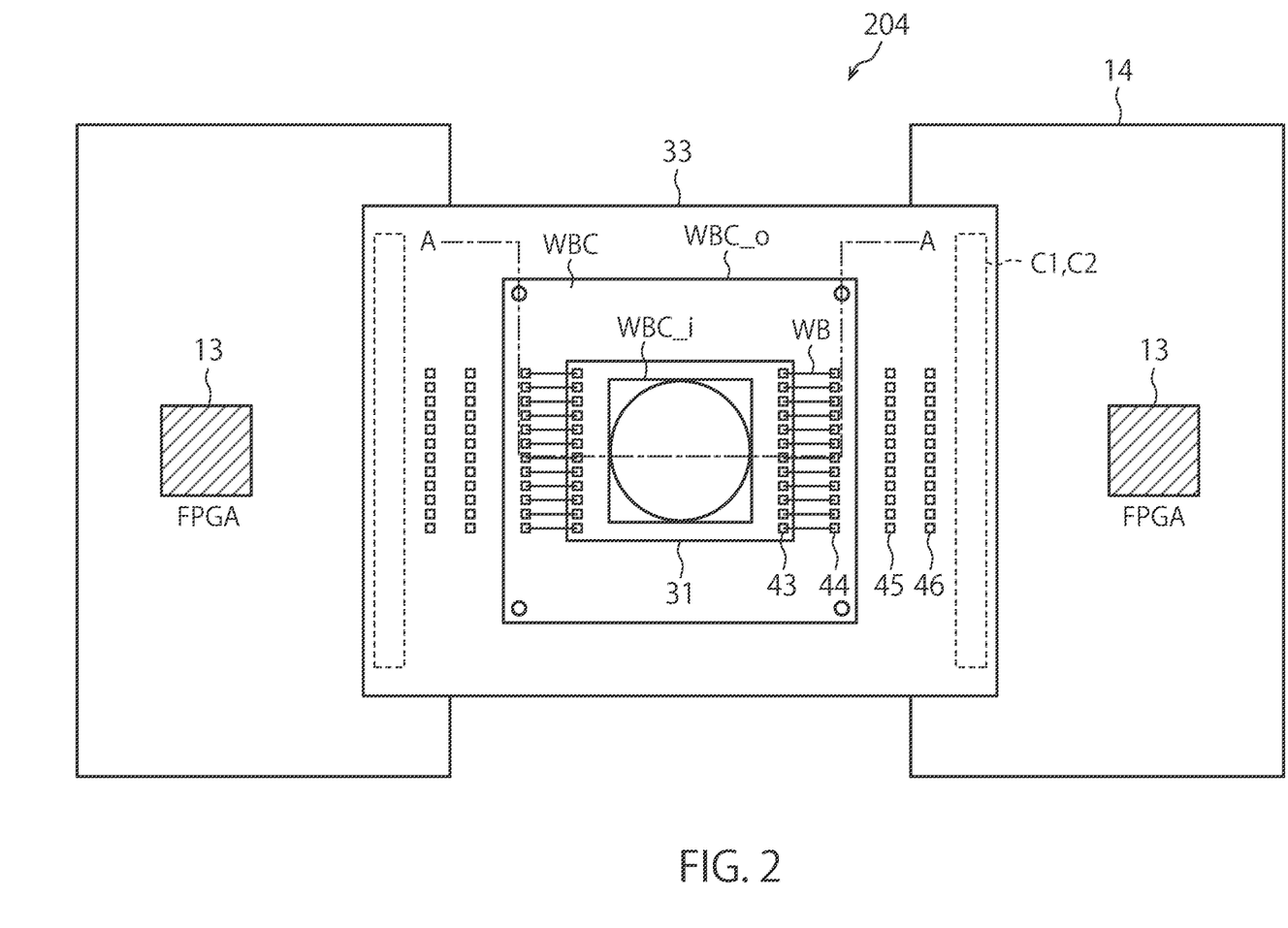
FIG. 2 is a plan view illustrating an example of a configuration of a blanking aperture array mechanism according to the first embodiment.
Figure 3:
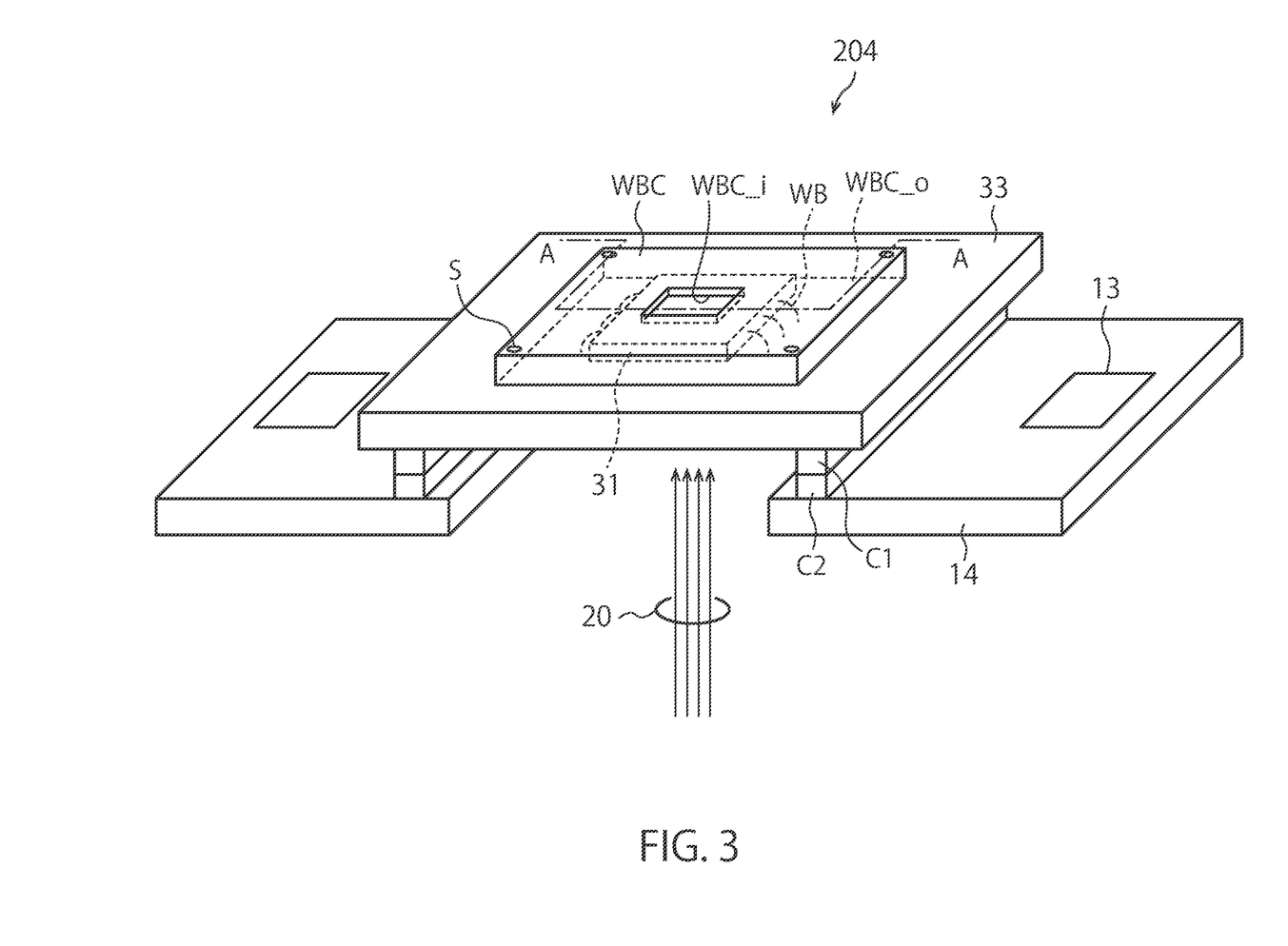
FIG. 3 is a perspective view illustrating an example of the configuration of the blanking aperture array mechanism according to the first embodiment.

FIG. 2 is a plan view illustrating an example of the configuration of the blanking aperture array mechanism 204 according to the first embodiment. FIG. 3 is a perspective view illustrating an example of the configuration of the blanking aperture array mechanism 204 according to the first embodiment. The blanking aperture array mechanism 204 being a blanking aperture array unit includes a BAA (Blanking Aperture Array) chip 31, bonding wires WB, a BAA substrate 33, and a bonding wire cover WBC (hereinafter, "cover WBC"). It is assumed that multi-beams 20 travel toward the front of the drawing of FIG. 2 and travel in an upward direction in the drawing of FIG. 3. In embodiments described below, the upper/lower direction of the BAA substrate 33 is a relative direction in a case where the direction of a surface on which the BAA chip 31 is provided is assumed as an upper direction and is sometimes different from the upper/lower direction according to gravity acceleration.

The BAA chip 31 being a chip controls the multi-beams 20a to 20e (hereinafter, also "multi-beams 20") illustrated in FIG. 1 by blanking control. The BAA chip 31 includes a plurality of exposed pads 43 for receiving a control signal to be used in the blanking control, and the pads 43 are electrically connected to an electronic circuit (not illustrated) on the silicon substrate via a predetermined line. For example, when the blanking control is in the ON state, a voltage is applied to the pads 43 and the multi-beams 20 are deflected. On the other hand, when the blanking control in the OFF state, no voltage is applied to the pads 43.

The bonding wires WB being lines are connected from the pads 43 on the BAA chip 31 to pads 44 on the BAA substrate 33, respectively. Accordingly, the bonding wires WB can electrically connect the BAA chip 31 to the BAA substrate 33. Therefore, a control signal for the blanking control can be transmitted from the BAA substrate 33 to the BAA chip 31.

The BAA substrate 33 being a substrate has the BAA chip 31 mounted thereon. The BAA substrate 33 includes lines (not illustrated) therein, which are connected to pads 45 and elements such as capacitors 46 on the BAA substrate 33, respectively. The lines in the BAA substrate 33 are also connected to a connector C1 provided on the back side of the BAA substrate 33. The connector C1 is used to connect the BAA substrate 33 to an FPGA (Field Programmable Gate Array) substrate 14. The BAA substrate 33 is, for example, non-conductive ceramic having a gold-plated surface. Charging (charge-up) of the surface of the BAA substrate 33 can be suppressed by the gold plating. However, to prevent the bonding wires WB from being in contact with the gold plating, the BAA substrate 33 around the bonding wires WB and the pads 44 includes a region not plated with gold. The BAA substrate 33 around the pads 45 and the capacitors 46 also includes a region not plated with gold. The material (for example, ceramic) of the non-conductive BAA substrate 33 is exposed in the regions not plated with gold. Therefore, the regions not plated with gold of the BAA substrate 33 are hereinafter referred to also as "exposed regions".

A connector C2 connected to the connector C1 is provided on the front side of the FPGA substrate 14. The BAA substrate 33 and the FPGA substrate 14 are connected to each other by these connectors C1 and C2 (see FIG. 3). The FPGA substrate 14 includes a plurality of transmission circuits 13 to transmit a control signal to the pads 43 on the BAA chip 31 via the connectors C1 and C2. For example, an FPGA is used as the transmission circuits 13. The transmission circuits 13 perform buffering of a high-speed signal supplied from outside of the FPGA substrate 14, transmission of the high-speed signal to the BAA chip 31, data error check, re-transmission request and re-reception processing of data, and the like. In the example illustrated in FIG. 2, for example, two transmission circuits 13 are arranged across the BAA chip 31.

The cover WBC being a covering member is provided to cover over the bonding wires WB while keeping electrical insulation from the bonding wires WB. When seen from the irradiation direction of the multi-beams 20 (a direction perpendicular to the drawing of FIG. 2) (in a view in the irradiation direction), the cover WBC is provided along the entire outer circumference of the BAA chip 31. An outer circumferential end portion (a first end) WBC_o of the cover WBC is connected onto the BAA substrate 33 and is fixed by threading screws S or the like. An inner circumferential end portion (a second end) WBC_i of the cover WBC is located on the BAA chip 31 and is provided so as not to be in contact with the BAA chip 31. That is, while connected and fixed to the BAA substrate 33, the cover WBC is separated from the BAA chip 31 and a gap G is provided between the inner circumferential end portion of the cover WBC and the BAA chip 31 (see FIG. 4). When seen from the irradiation direction of the multi-beams 20, the cover WBC has a substantially quadrangular ring shape and enables the multi-beams 20 to pass through a central portion thereof. Therefore, the cover WBC does not interfere with travel of the multi-beams 20. While the cover WBC in the present embodiment is constituted of an integrally formed metallic body to cover the bonding wires WB, the cover WBC is not limited thereto and may be a structure in which a plurality of members such as an upper surface and side surfaces are coupled to each other. In short, the cover WBC is not particularly limited to an integrally formed structure as long as it is a structure constituted of a plurality of members that prevent scattered electrons from directly or indirectly entering exposed bonding wires WB and pads 43 and 44.

For example, a non-magnetic and conductive metal such as titanium is used as the material of the cover WBC. Due to the non-magnetic property of the cover WBC, the multi-beams 20 can be suppressed from being deflected by the magnetic field of the cover WBC. Due to the conductive property of the cover WBC, the cover WBC can be grounded and scattered electrons resulting from the multi-beams 20 can be released to the ground. Accordingly, the cover WBC suppresses the scattered electrons from approaching the bonding wires WB and prevents an operation failure in the blanking control or the circuit elements caused by the scattered electrons. A more detailed configuration of the cover WBC and a cross-sectional structure along a line A-A in FIGS. 2 and 3 will be explained later with reference to FIG. 4.

As illustrated in FIG. 3, the BAA chip 31 is mounted on the BAA substrate 33. The cover WBC is provided on the BAA substrate 33 and the BAA chip 31 so as to cover the bonding wires WB.

The lower surface of the BAA substrate 33 is connected to the FPGA substrate 14 via the connectors C1 and C2. The BAA substrate 33 can be replaced by detaching the connector C1 and the connector C2.

Next, the cover WBC is explained with reference to FIG. 4.

Figure 4:
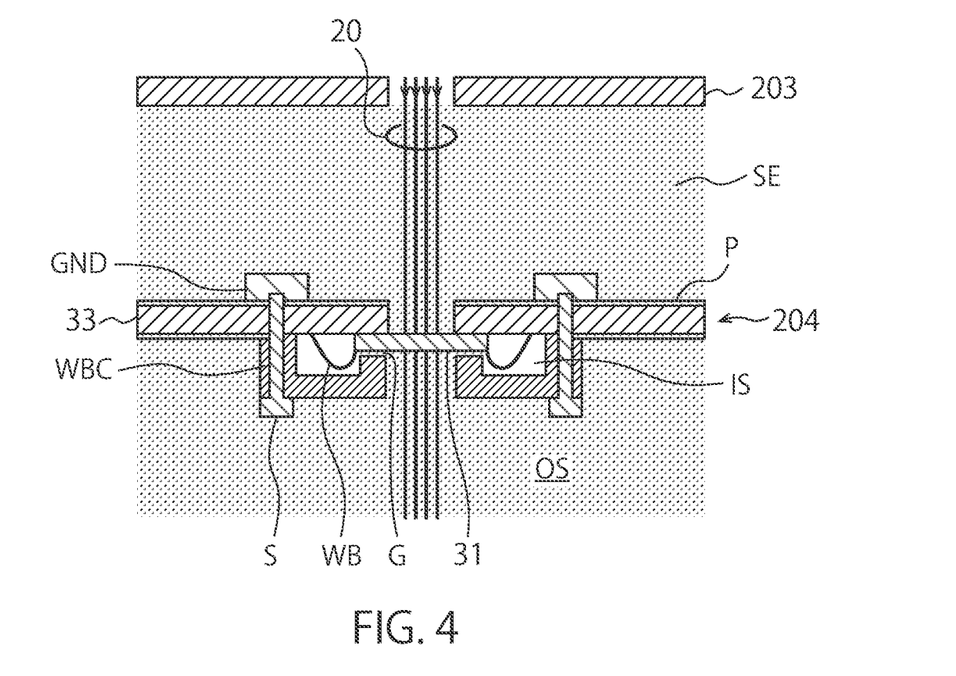
FIG. 4 is a sectional view illustrating an example of the configuration of the blanking aperture array mechanism according to the first embodiment.

FIG. 4 is a sectional view illustrating an example of the configuration of the blanking aperture array mechanism 204 according to the first embodiment. FIG. 4 illustrates a cross section taken along the line A-A in FIGS. 2 and 3. It is assumed that the multi-beams 20 travel in a downward direction in FIG. 4. Therefore, it is to be noted that the upper-lower relation of the blanking aperture array mechanism 204 illustrated in FIG. 4 is opposite to that of the blanking aperture array mechanism 204 illustrated in FIG. 3.

In FIG. 4, at the time of shaping of the electron beam 200 by the shaping aperture array substrate 203, electrons are scattered on the inner surfaces of the openings of the shaping aperture array substrate 203 and scattered electrons SE are produced. The scattered electrons SE spread over the space around the blanking aperture array mechanism 204.

The cover WBC is provided from the BAA substrate 33 to the BAA chip 31. The cover WBC is, for example, fixed to the BAA substrate 33 with the screws S. In FIG. 4, the outer circumferential end portion WBC_o of the cover WBC is fixed to the BAA substrate 33. The cover WBC has, for example, a quadrangular shape and is fixed with the screws S on four corners (see FIG. 3).

A grounding member GND is provided on the lower surface of the BAA substrate 33. The grounding member GND is connected to the electron lens barrel 102 having a large capacity, or the like and functions as ground. The upper surface, the lower surface, and the side surfaces of the BAA substrate 33 are plated with gold (P) and are electrically connected to the grounding member GND. Therefore, the upper surface and the lower surface of the BAA substrate 33 are grounded with the gold plating P. The cover WBC is also electrically connected to the grounding member GND via the gold plating P of the BAA substrate 33. Furthermore, the screws S have a conductive property and are connected to the grounding member GND. Therefore, the cover WBC is grounded via the gold plating P and the screws S. The grounding member GND has both a function to apply a ground voltage and a function to receive the screws S to fix the cover WBC.

As explained with reference to FIG. 2, there are exposed regions not plated with gold on the BAA substrate 33 around the bonding wires WB and the pads 44. If the scattered electrons SE reach the exposed regions of the non-conductive BAA substrate 33, the BAA substrate 33 is adversely charged. If excessive and irregular scattered electrons SE enter the bonding wires WB, noise occurs in the control signal for the blanking control.

Therefore, the conductive cover WBC covers over the bonding wires WB, including the exposed regions of the BAA substrate 33. This can suppress the scattered electrons SE from entering the cover WBC. Accordingly, the BAA substrate 33 around the bonding wires WB and the pads 44 can be suppressed from being charged. Furthermore, occurrence of noise in the control signal for the blanking control due to entering of the electrons into the bonding wires WB can be suppressed. Since being constituted of a conductive material, the cover WBC needs to be electrically separated from the bonding wires WB.

As described above, while the outer circumferential end portion (the first end) of the cover WBC for the multi-beams 20 is in contact with the BAA substrate 33, the gap G is provided between the inner circumferential end portion (the second end) of the cover WBC and the BAA chip 31. The bonding wires WB are provided in an inner space IS surrounded by the BAA chip 31, the BAA substrate 33, and the cover WBC in a portion other than the gap G. As the gap G is narrower, the scattered electrons SE are less likely to enter the cover WBC. Therefore, it can be said that it is more preferable that the gap G is narrower. Meanwhile, if the cover WBC is in contact with the BAA chip 31, load is applied on the BAA chip 31 and metallic thin films of circuits on the BAA chip 31 are damaged. Accordingly, a small gap G is provided between the BAA chip 31 and the cover WBC. The width of the gap G is, for example, 0.3 mm. The cover WBC separates the inner space IS from an outer space OS that is located outside the cover WBC in a region other than the gap G. This enables the cover WBC to suppress the scattered electrons from approaching the bonding wires WB while suppressing damages of the BAA chip 31.

As described above, according to the first embodiment, the cover WBC is provided to cover the bonding wires WB that electrically connect the BAA chip 31 to the BAA substrate 33. Since the cover WBC has a conductive property, entering of the scattered electrons to the inside of the cover WBC is suppressed. Accordingly, charging of the exposed regions of the BAA substrate 33 with the scattered electrons SE is suppressed. As a result, malfunctions of the BAA chip 31 and the BAA substrate 33 can be suppressed. Furthermore, occurrence of noise in the control signal for the blanking control due to the scattered electrons SE can be suppressed.

Furthermore, the locations of at least two end sides (sides of the inner circumference toward the pads 43) of the inner circumferential end portion (the second end) WBC_i of the cover WBC illustrated in FIG. 2 are nearer the central portion of the BAA chip 31 than are the locations of the pads 43 formed on the end portion of the BAA chip 31.

The cover WBC may be provided so as to cover the pads 45, the capacitors 46, and the like illustrated in FIG. 2 as well as the bonding wires WB. This enables charging of the BAA substrate 33 around the pads 45 and the capacitors 46 to be suppressed.

The outer circumferential end portion WBC_o of the cover WBC illustrated in FIG. 4 is in contact with the BAA substrate 33 along the entire outer edge of the BAA chip 31. However, a portion of the outer circumferential end portion WBC_o of the cover WBC may be open without being in contact with the BAA substrate 33. Many times of scattering are required for the scattered electrons SE to reach the outer circumferential end portion WBC_o distant from the openings of the shaping aperture array substrate 203, which reduces the number of the scattered electrons SE and energy thereof. Therefore, even when a portion of the outer circumferential end portion WBC_o is away from the BAA substrate 33, influences of the scattered electrons SE on the malfunction of the blanking control or the circuit elements are small.

In FIG. 4, the multi-beams 20 are emitted from the back surface of the BAA substrate 33 opposite to the front surface where the cover WBC is provided. However, the multi-beams 20 may be emitted from the front surface of the BAA substrate 33 where the cover WBC is provided.

Second Embodiment

Figure 5:
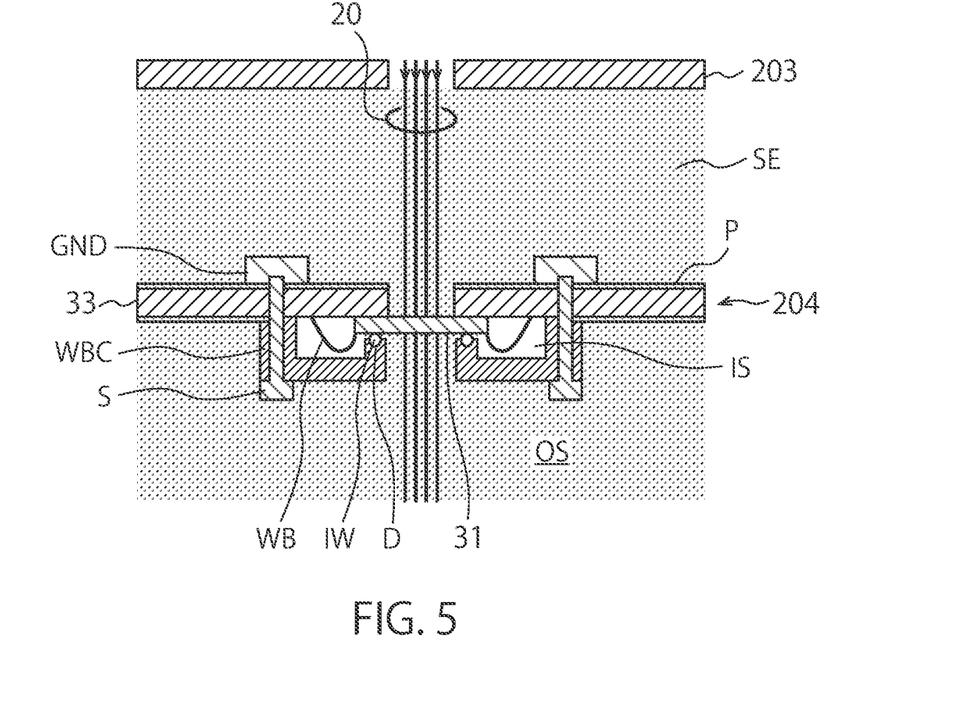
FIG. 5 is a sectional view illustrating an example of a configuration of a blanking aperture array mechanism according to a second embodiment.

FIG. 5 is a sectional view illustrating an example of the configuration of the blanking aperture array mechanism 204 according to a second embodiment. The second embodiment is different from the first embodiment in that a shielding member IW is provided on the inner circumferential end portion WBC_i of the cover WBC.

The shielding member IW is provided between the inner circumferential end portion WBC_i of the cover WBC and the BAA chip 31. When seen from the irradiation direction of the multi-beams 20, the cover WBC and the shielding member IW are provided along the outer edge of the BAA chip 31. The shielding member IW is provided between the cover WBC and the BAA chip 31 to close the gap G. To prevent the BAA chip 31 from being damaged, a softer material than the material of the BAA chip 31 is used as the shielding member IW. With this provision of the shielding member IW to close the gap G, the scattered electrons SE are less likely to enter the inner space IS that is surrounded by the cover WBC and the shielding member IW and that includes the bonding wires WB. That is, the cover WBC and the shielding member IW separate the inner space IS from the outer space OS that is located outside the cover WBC and the shielding member IW, and protects the bonding wires WB from the scattered electrons SE.

Since the rest of the configurations of the blanking aperture array mechanism 204 according to the second embodiment is identical to the corresponding one of the blanking aperture array mechanism 204 according to the first embodiment, detailed explanations thereof are omitted.

The shielding member IW is preferably non-conductive to suppress deflection of the multi-beams 20 caused by a magnetic field. The shielding member IW is preferably conductive to ground the BAA chip 31 via the cover WBC and to prevent the BAA chip 31 from being charged. These properties can increase the grounding capacity of the BAA chip 31. Furthermore, the shielding member IW is preferably of a material deformable by pressure or heat.

For example, an indium wire shaped in a quadrangular form is used as an example of the shielding member IW. Indium is soft and plastically deforms at ordinary temperatures. Therefore, when the BAA chip 31 is fixed to the BAA substrate 33, the shielding member IW is squeezed between the BAA chip 31 and the BAA substrate 33 and has an elliptical cross section to tightly adhere to the BAA chip 31 and the BAA substrate 33. The circuit elements such as an FPGA produce heat due to the blanking control. The BAA chip 31 and the cover WBC are thermally expanded by this heat. Therefore, the shielding member IW is further squeezed and more tightly adheres to the BAA chip 31 and the cover WBC. Since the shielding member IW is also thermally expanded, the shielding member IW further tightly adheres to the BAA chip 31 and the cover WBC. That is, the gap G between the cover WBC and the BAA chip 31 is further filled and closed. Accordingly, entering of the scattered electrons SW into the cover WBC can be further suppressed.

The shielding member IW is preferably softer than the material constituting the BAA chip 31. For example, it is preferable that the shielding member IW is soft enough to prevent breaking of the circuits with the metallic thin film on the BAA chip 31. If lines on the BAA chip 31 are removed or the lines short-circuit with each other at the time of fixing the cover WBC, the BAA chip 31 becomes unusable. Damaging of the BAA chip 31 can thus be suppressed by the soft shielding member IW like indium. Gold or platinum can be used depending on the hardness of the BAA chip 31. In this case, sheet-like gold or platinum cut into a quadrangular form is used and a sheet having a cross section that is an extremely thin rectangle is filled in the gap G between the cover WBC and the BAA chip 31 to close the gap G.

The locations of at least two end sides (sides of the inner circumferential toward the pads 43) of the inner circumferential end portion (WBC_i in FIG. 2) of the cover WBC are nearer the central portion of the BAA chip 31 than are the locations of the pads 43 formed on the end portion of the BAA chip 31.

The cross-sectional shape of the shielding member IW is preferably a shape with no corners, such as a substantially circular shape or an elliptical shape. With this shape, even if the shielding member IW is brought into contact with the BAA chip 31, damages of the BAA chip 31 can be suppressed because force is less likely to be concentrated on a narrow area.

(Modification)

Figure 6A:
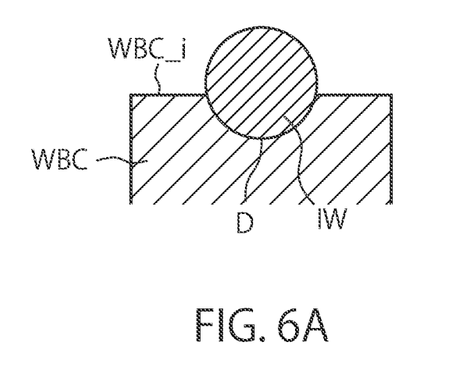
FIGS. 6A and 6B are sectional views enlargedly illustrating an inner circumferential end portion and a shielding member according to a modification.
Figure 6B:
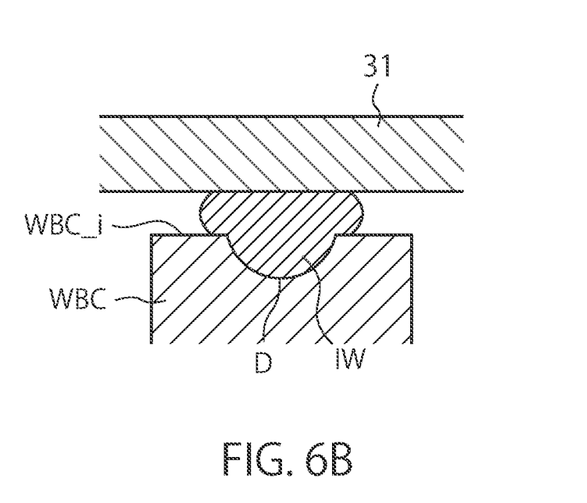

FIGS. 6A and 6B are sectional views enlargedly illustrating the inner circumferential end portion WBC_i and the shielding member IW according to a modification. The cover WBC may have a groove D (squeeze) for fitting the shielding member IW in the inner circumferential end portion WBC_i. The groove D is provided on an opposing surface to the BAA chip 31 in the inner circumferential end portion WBC_i of the cover WBC and is provided entirely along the inner circumferential end portion WBC_i. The cross section of the groove D can be set so as to conform to the cross-sectional shape of the shielding member IW. For example, when the shielding member IW has a substantially circular cross section, it is preferable that the cross section of the groove D is substantially circular as a substantially semicircular shape illustrated in FIG. 6A. By fitting the shielding member IW in the groove D, the shielding member IW is not removed from the cover WBC when the cover WBC is attached to the BAA substrate 33. When the cover WBC is attached to the BAA substrate 33, the shielding member IW illustrated in FIG. 6B is brought into contact with the BAA chip 31 to be pressed and slightly squeezed and fills the inside of the groove D. Accordingly, the shielding member IW satisfactorily adheres to the cover WBC and can suppress the scattered electrons SE from entering the cover WBC. However, the shape and depth of the groove D are not particularly limited as long as they are set so as not to damage the BAA chip 31.

The blanking aperture array mechanism 204 according to the second embodiment can suppress charging of the BAA substrate 33 with the scattered electrons SE and can suppress occurrence of noise in the control signal for the blanking control caused by the scattered electrons SE, similarly to the blanking aperture array mechanism 204 according to the first embodiment.

The BAA chip 31 has a grounding area increased by contact with the grounded shielding member IW. The BAA chip 31 is grounded via a portion of the pads 43. Since the grounded area is further increased by the shielding member IW, stabler blanking control can be executed.

The material of the shielding member IW according to the second embodiment is not limited to indium and may be other materials. For example, the shielding member IW may be replaced with a conductive O-ring. The conductive O-ring is, for example, an O-ring of fluororubber containing a carbon filler. The conductive O-ring can fill the gap G between the cover WBC and the BAA chip 31 by elastic deformation. In a case in which the conductive O-ring is used, the depth and width of the groove D of the cover WBC are set according to the shape of the O-ring. Other materials such as conductive paste, a conductive adhesive, an Ag/In alloy, soldering, and a hollow metal O-ring may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A blanking aperture array unit comprising:
   a chip configured to control a charged particle beam by blanking control of switching whether to irradiate a target with the charged particle beam;
   a substrate having the chip mounted thereon;
   a wire configured to electrically connect pads on the chip to the substrate and transmit a control signal for the blanking control from the substrate to the chip through the pads; and
   a conductive covering member having a first end connected to the substrate and a second end located on the chip, the covering member being provided from the first end to the second end to cover the wire while maintaining electrical insulation from the wire, wherein
   at least two end sides of the second end of the covering member are nearer a central portion of the chip than locations of the pads on the chip.

2. The unit of claim 1, further comprising a shielding portion being non-magnetic and having a conductive property in a gap provided between the chip and the second end of the covering member.

3. The unit of claim 2, wherein the covering member is provided along an outer edge of the chip in a view in an irradiation direction of the charged particle beam.

4. The unit of claim 3, wherein a material of the shielding portion is deformable by pressure or heat.

5. The unit of claim 2, wherein a material of the shielding portion is deformable by pressure or heat.

6. The unit of claim 4, wherein the second end of the covering member is provided with a groove in which the shielding portion can be fitted.

7. The unit of claim 4, wherein a material of the shielding portion is indium.

8. The unit of claim 5, wherein a material of the shielding portion is indium.

9. The unit of claim 2, wherein the wire is provided in an inner space surrounded by the chip, the substrate, the covering member, and the shielding portion.

10. The unit of claim 2, further comprising a metallic film provided on a surface of the substrate and grounded, wherein
    the covering member and the shielding portion electrically connect the chip to the metallic film.

11. The unit of claim 2, wherein a material of the shielding portion is softer than a member constituting the chip.

12. The unit of claim 2, wherein a cross section of the shielding portion has a substantially circular shape or a substantially elliptical shape.

13. The unit of claim 2, wherein the covering member and the shielding portion are provided along an outer edge of the chip when seen from an irradiation direction of the charged particle beam.

14. The unit of claim 13, wherein the covering member and the shielding portion separate the inner space from an outer space of the covering member and the shielding portion.

* * * * *